(12) United States Patent
Lim et al.

(10) Patent No.: US 7,126,172 B2
(45) Date of Patent: Oct. 24, 2006

(54) INTEGRATION OF MULTIPLE GATE DIELECTRICS BY SURFACE PROTECTION

(75) Inventors: Sangwoo Lim, Austin, TX (US); Laegu Kang, Austin, TX (US); Geoffrey (Choh-Fei) Yeap, San Diego, CA (US)

(73) Assignee: Freescale Semiconductor, Inc., Austin, TX (US)

( * ) Notice: Subject to any disclaimer, the term of this patent is extended or adjusted under 35 U.S.C. 154(b) by 1 day.

(21) Appl. No.: 10/962,944

(22) Filed: Oct. 12, 2004

(65) Prior Publication Data

US 2006/0079047 A1   Apr. 13, 2006

(51) Int. Cl.
*H01L 29/80* (2006.01)
*H01L 31/112* (2006.01)

(52) U.S. Cl. ............... 257/275; 257/324; 257/E21.679; 257/E27.103

(58) Field of Classification Search ............... 257/275, 257/324
See application file for complete search history.

(56) References Cited

U.S. PATENT DOCUMENTS

| | | | | |
|---|---|---|---|---|
| 6,087,211 A | * | 7/2000 | Kalnitsky et al. | 438/232 |
| 6,225,167 B1 | * | 5/2001 | Yu et al. | 438/275 |
| 6,399,448 B1 | * | 6/2002 | Mukhopadhyay et al. | 438/275 |
| 6,759,302 B1 | * | 7/2004 | Chen et al. | 438/275 |
| 6,787,416 B1 | * | 9/2004 | Kuo et al. | 438/258 |
| 6,787,419 B1 | * | 9/2004 | Chen et al. | 438/265 |
| 6,953,727 B1 | * | 10/2005 | Hori | 438/275 |
| 2004/0214398 A1 | * | 10/2004 | Chen et al. | 438/275 |
| 2005/0106813 A1 | * | 5/2005 | Lee et al. | 438/257 |

OTHER PUBLICATIONS

Lim, Hoon et al., "The Effects of STI Process Parameters on the Integrity of Dual Gate Oxides"; IEEE 01CH37167, 39th Ann. Intl. Reliability Physics Symposium, Orlando, FL 2001; pp. 48-51.
Chau, Robert, "Advanced Metal Gate/High-K Dielectric Stacks for High-Performance CMOS Transistors"; Components Research, Logic Technology Development, Intel Corporation, 3 pages total; document not dated.
Chau, Robert et al., Gate Dielectric Scaling for High-Performance CMOS: from SiO₂ to High-K; 3 pages total; document not dated.

* cited by examiner

*Primary Examiner*—Fernando L. Toledo
(74) *Attorney, Agent, or Firm*—Fortkort & Houston P.C.; John A. Fortkort

(57) ABSTRACT

A multiple gate oxidation process is provided. The process comprises the steps of (a) providing a silicon substrate (203) having a sacrificial oxide layer (207) thereon; (b) depositing and patterning a first layer of photoresist (209) on the sacrificial oxide layer, thereby forming a first region in which the sacrificial oxide layer is exposed; (c) etching the exposed sacrificial oxide layer within the first region, thereby forming a first etched region; (d) growing a first oxide layer (211) within the first etched region; (e) depositing and patterning a second layer of photoresist (213) on the sacrificial oxide layer and first oxide layer, thereby forming a second region in which the sacrificial oxide layer is exposed; (f) etching the exposed sacrificial oxide layer within the second region, thereby forming a second etched region; and (g) growing a second oxide layer (215) within the second etched region.

26 Claims, 4 Drawing Sheets

INTEGRATION OF MULTIPLE GATE DIELECTRICS BY SURFACE PROTECTION

FIELD OF THE INVENTION

The present invention relates generally to the fabrication of semiconductor devices, and relates more particularly to methods for protecting surfaces during multiple gate dielectrics integration.

BACKGROUND OF THE INVENTION

In certain integrated circuits (ICs), such as those based on System-On-a-Chip (SOC) technology, various semiconductor devices having various functionalities are formed on a single chip in order to satisfy the requirements and needs of the end use products. When these semiconductor devices operate at different voltages, the fabrication of the integrated circuit typically requires the formation of dielectric layers having varying thicknesses and compositions. For example, high voltage power transistors, such as those used to program EEPROM devices, typically require thicker gate oxides than the lower voltage transistors associated with memory storage in DRAM circuitry.

Various approaches have been developed in the art for forming gate oxide layers having different thicknesses as required to accommodate the particular voltage requirements of different devices present on the same integrated circuit. Such multi gate oxide structures, which may include triple gate oxide (TGO) structures and quadruple gate oxide (QGO) structures, may be achieved, for example, by using a separate process to provide each of the gate oxide thicknesses required by the various devices in the integrated circuit.

Alternately, gate oxide layers having different thicknesses may be formed by dividing a chip into multiple regions, and then providing each region with a specific gate oxide thickness. For instance, it is possible to form a chip such that it is divided into three separate regions with associated gate oxide layers having thicknesses suitable for high voltage, low voltage and medium voltage devices. Accordingly, it is required that the multi gate oxide layer formation technology that is used to fabricate such devices is capable of producing gate oxide layers of varying thicknesses as required to accommodate the needs of a particular device.

Despite the development of the aforementioned processes for forming gate oxide layers having different thicknesses in the same integrated circuit, these processes suffer from some notable infirmities. In particular, the performance characteristics of devices manufactured by these processes are frequently less than optimal. Often, these characteristics are particularly poor in the core devices.

There is thus a need in the art for a multi gate oxide process, and for products manufactured by this process, that overcome this infirmity. In particular, there is a need in the art for a method for manufacturing multi gate oxide devices in which the performance characteristics of the core devices are comparable to the devices disposed elsewhere in the integrated circuit. These and other needs are met by the methodologies and devices described herein.

SUMMARY OF THE INVENTION

In one aspect, a method is provided herein for forming a multi gate oxide structure. In accordance with this method, a substrate, which is preferably a silicon substrate such as a chip or wafer, is provided which has a sacrificial oxide layer disposed thereon. A first region of the substrate is exposed, as by chemical etching used in combination with a masking scheme or through other suitable means, after which a first gate oxide layer is grown on the exposed substrate within the first region. A second region of the substrate, which does not substantially overlap the first region, is then exposed, as by chemical etching used in combination with a masking scheme or through other suitable means, after which a second gate oxide layer is grown on the exposed substrate within the first region. Preferably, the first and second regions are mutually exclusive.

In another aspect, a method for forming a multi gate oxide structure is provided. In accordance with the method, a semiconductor substrate is provided having an initial oxide layer thereon. A first layer of photoresist is deposited and patterned on the initial oxide layer, thereby forming a first region in which the initial oxide layer is exposed, after which the initial oxide layer is etched within the first region, thereby forming a first etched region. A first gate oxide layer is then formed within the first etched region. Next, a second layer of photoresist is deposited and patterned on the initial oxide layer and first oxide layer, thereby forming a second region in which the initial oxide layer is exposed. The exposed initial oxide layer is etched within the second region, thereby forming a second etched region that does not substantially overlap with the first etched region. Finally, a second oxide layer is grown within the second etched region.

In another aspect, a multi gate oxide structure is provided. The structure comprises a semiconductor substrate having a first major surface with first and second regions thereon, wherein the first region is vertically disposed by a distance $d_1$ from the first major surface, and wherein the second region is vertically disposed by a distance $d_2$ from the first major surface. A first gate oxide layer having a first average thickness is disposed within the first region, and a second gate oxide layer having a second average thickness is disposed within the second region.

In yet another aspect, a semiconductor structure is provided which comprises a semiconductor substrate, a first gate oxide layer disposed over a first region of said substrate, a sacrificial oxide layer disposed over a second region of said substrate, and a mask disposed over said first oxide layer and over a first portion of said sacrificial oxide layer, said mask being patterned so as to expose a second portion of said sacrificial oxide layer.

These and other aspects of the present disclosure are described in greater detail below.

DETAILED DESCRIPTION

It has now been found that the aforementioned problems with respect to device performance characteristics in a multi gate oxide device may be solved through the utilization of a masking technique that selectively exposes one region of a substrate at a time for the formation of a gate oxide layer having the particular thickness required for that region. This process permits each region of a silicon substrate on which devices are to be built to be exposed to oxide etching and pre-cleaning only once.

Without wishing to be bound by theory, it is believed that the observed decrease in device performance associated with conventional multi gate oxide processes arises, at least in part, from excessive roughening of the silicon surfaces on which the devices are grown, and that this excessive roughening results from multiple exposures to the wet chemicals commonly used in oxide etch and pre-clean processes. In conventional multi gate oxide processes, the number of exposures increases with each level of integration, and is greatest for core devices. Hence, the degree of roughening, and the associated decrease in device performance, would also be expected to increase with each level of integration, and would be expected to be most significant for core devices. This is consistent with observations.

Thus, for example, if there is a 3% decrease in device performance for each level of integration, there will be a 3% decrease in performance in going from a single gate oxide integration to a dual gate oxide (DGO) integration, a 6% decrease in device performance in going from a single gate oxide integration to a triple gate oxide (TGO) integration, and a 9% decrease in device performance in going from a single gate oxide integration to a quadruple gate oxide (QGO) integration. Given the current need for highly integrated devices, the methodologies and devices described herein provide a much needed means for significantly improving device performance (especially core device performance) in highly integrated structures.

The infirmities of conventional processes for forming multi gate oxide structures as described above may be better understood with reference to the particular prior art process depicted in FIGS. 1–12. For clarity of illustration, the features of the structures in each step of this process have been greatly simplified.

Figure 1:
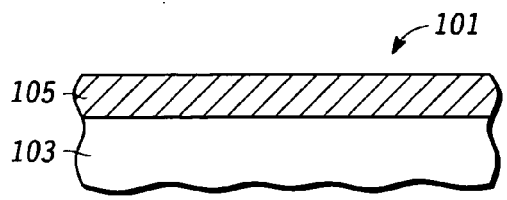
FIGS. 1–12 are illustrations of a prior art multiple gate oxide fabrication process.

As shown in FIG. 1, this process typically begins with a structure 101 comprising a silicon substrate 103 upon which is disposed a sacrificial oxide layer 105. The silicon substrate is typically a silicon wafer, and the sacrificial oxide layer is typically silicon oxide.

Figure 2:
Figure 3:
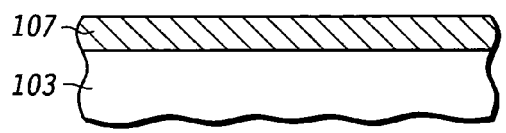
Figure 4:
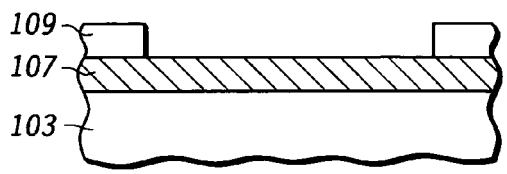
Figure 5:

The sacrificial oxide layer 105 is then stripped with a suitable wet etch as shown in FIG. 2, and a first gate oxide layer 107 is grown as shown in FIG. 3. A layer of photoresist 109 is then deposited and patterned as shown in FIG. 4 using conventional photolithography techniques, thus exposing a portion of the first gate oxide layer. The exposed portion of the first gate oxide layer 107 is then etched (typically with wet chemicals) down to the silicon substrate. The layer of photoresist 109 is then stripped, yielding the structure shown in FIG. 5.

Figure 6:
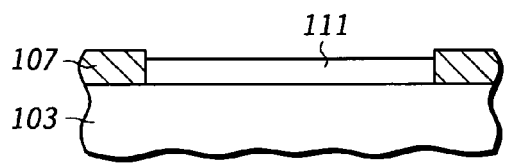
Figure 7:
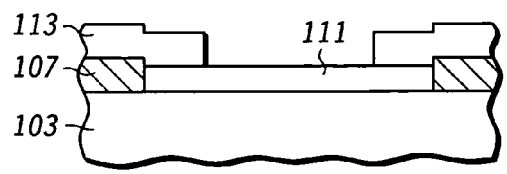
Figure 8:
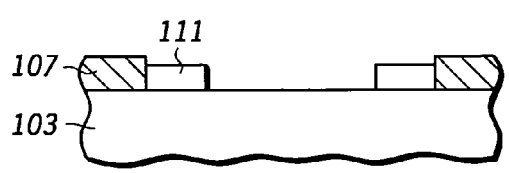

As shown in FIG. 6, a second gate oxide layer 111 is grown over the exposed region of the substrate. A layer of photoresist 113 is then deposited over the structure and is patterned using conventional photolithography techniques, thus yielding the structure shown in FIG. 7 in which a region of the second gate oxide layer 111 is exposed. The exposed portion of the second gate oxide layer 111 is then etched down to the silicon substrate (typically through the use of wet chemicals) and the layer of photoresist 113 is stripped, thus yielding the structure shown in FIG. 8 in which a region of the silicon substrate 103 is exposed.

Figure 9:
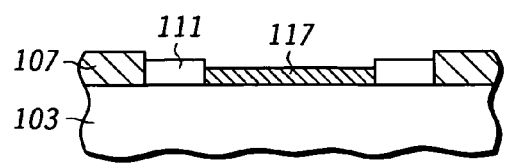
Figure 10:
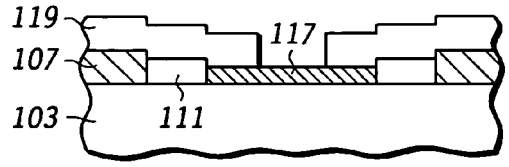
Figure 11:
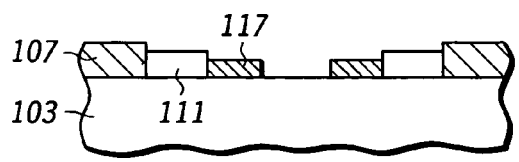
Figure 12:
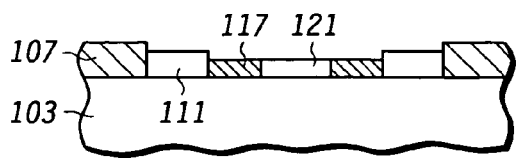

As shown in FIG. 9, a third gate oxide layer 117 is grown over the exposed region of the silicon substrate 103. A layer of photoresist 119 is then deposited over the structure and is patterned through conventional photolithography techniques, thus yielding the structure depicted in FIG. 10 in which a region of the third gate oxide layer 117 is exposed. The exposed portion of the third gate oxide layer 117 is then etched (typically through the use of wet chemicals) down to the silicon substrate 103, followed by a photoresist strip, thus yielding the device shown in FIG. 11 in which a region of the silicon substrate 103 is exposed. A fourth gate oxide layer 121, which defines the gate oxide for the core devices, is then grown over the exposed region of the silicon substrate 103 as shown in FIG. 12.

It will be appreciated from the description of the aforementioned conventional process that, with each level of integration, the portion of the silicon substrate on which the devices are grown is subjected to an additional wet etch and photoresist strip. The silicon substrate will also typically be exposed, with each level of integration, to an additional precleaning step prior to the growth of the gate oxide to ensure that the exposed surface is free of contaminants. Thus, in the particular process illustrated, by the time the gate oxide for the core devices has been grown, the silicon underlying the core devices has been exposed to four wet etches, four photoresist strips, and four pre-clean processes. As previously noted, the effect of these processes on the surface roughness of the silicon substrate is often cumulative, and can lead to excessive roughening of the silicon surface (and attendant decreases in device performance characteristics) in more highly integrated devices, with the effect being particularly prominent in the core areas of the structure.

The methodologies of the present disclosure overcome these infirmities through the utilization of a masking technique that selectively exposes one region of the substrate at a time for the formation of a gate oxide layer having the particular thickness required for that region. These methodologies permit each region of the substrate upon which semiconductor devices are to be built to be exposed only once to the wet chemicals used for oxide etching, photoresist stripping and pre-cleaning. Hence, as compared to conventional multi gate oxide processes, the methodologies disclosed herein minimize roughening of the substrate and maximize device performance, particularly in the core areas of the integrated circuit.

The methodologies disclosed herein may be better understood with reference to the non-limiting embodiment depicted in FIGS. 13–25, it being understood that many variations in this embodiment are possible. For clarity of illustration, the features of the structures in each step of this process have been greatly simplified.

Figure 13:
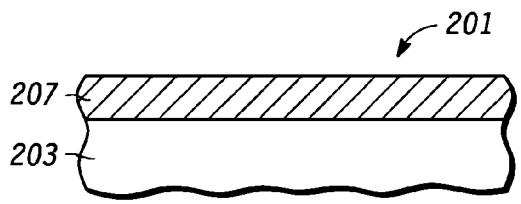
FIGS. 13–25 are illustrations of a multiple gate oxide fabrication process in accordance with the teachings herein.

As shown in FIG. 13, the depicted process begins with the provision of a structure 201 which comprises a substrate 203 having a sacrificial oxide layer 207 disposed thereon. The substrate is preferably a silicon substrate such as a silicon wafer or chip, and the sacrificial oxide layer is preferably silicon oxide. However, one skilled in the art will appreciate that the methodologies disclosed herein are not particularly limited to any particular substrate or sacrificial oxide. Rather, the principles disclosed herein are more broadly applicable to a variety of substrates upon which semiconductor devices are grown, and to the various oxides employed with these substrates.

Figure 14:
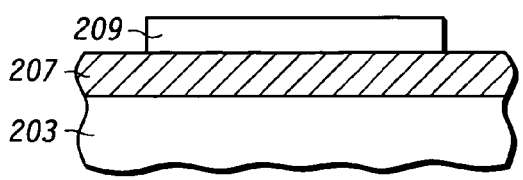
Figure 15:
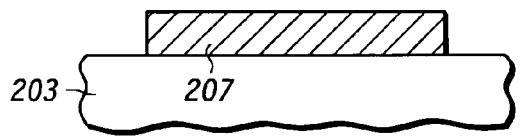

As shown in FIG. 14, a layer of photoresist 209 is deposited over the layer of sacrificial oxide 207 and is patterned through the use of suitable photolithography techniques. This results in the structure depicted in FIG. 14 in which a region of the sacrificial oxide layer 207 is exposed. The exposed region of the sacrificial oxide layer 207 is then etched down to the silicon substrate and the layer of photoresist is stripped, thus yielding the structure in FIG. 15.

Figure 16:
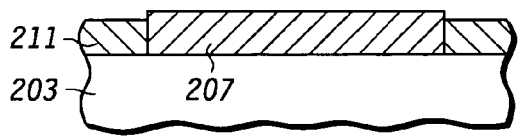
Figure 17:
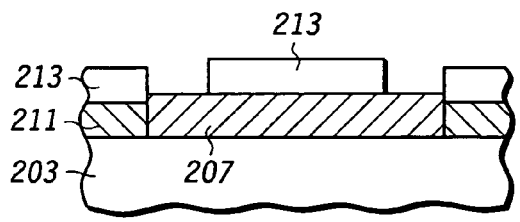

As shown in FIG. 16, a first gate oxide layer 211 is grown on the exposed portion of the silicon substrate 203. If desired, the exposed portion of the silicon substrate may be subjected to a pre-cleaning process prior to the growth of the first gate oxide layer 211. A layer of photoresist 213 is then deposited on the structure and is patterned through suitable photolithography techniques, thus yielding the structure depicted in FIG. 17 in which a portion of the sacrificial oxide layer 207 is exposed.

Figure 18:
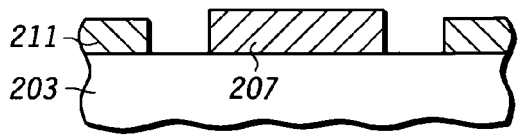
Figure 19:
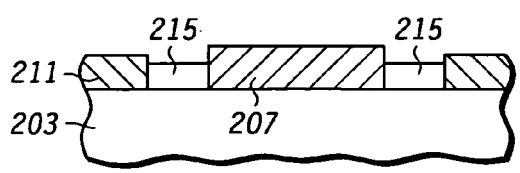

As shown in FIG. 18, the exposed portion of the sacrificial oxide layer 207 is then etched down to the silicon substrate, and the layer of photoresist is stripped. A second gate oxide layer 215 is then grown on the exposed portion of the silicon substrate 203 as shown in FIG. 19. If desired, the exposed portion of the silicon substrate may be subjected to a pre-cleaning process prior to the growth of the second gate oxide layer.

Figure 20:
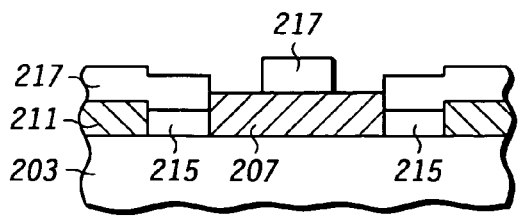
Figure 21:
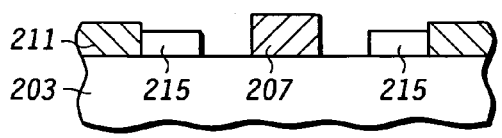
Figure 22:
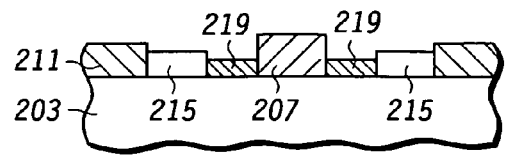

Next, a layer of photoresist 217 is deposited over the structure and is patterned through suitable photolithography techniques, thus yielding the structure depicted in FIG. 20 in which a portion of the sacrificial oxide layer 207 is exposed. As shown in FIG. 21, the exposed portion of the sacrificial oxide layer 207 is then etched down to the silicon substrate 203, and the layer of photoresist is stripped. A third gate oxide layer 219 is then grown on the exposed portion of the silicon substrate 203 as shown in FIG. 22. If desired, the exposed portion of the silicon substrate may be subjected to a pre-cleaning process prior to the growth of the third gate oxide layer 219.

Figure 23:
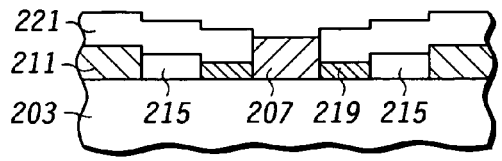
Figure 24:
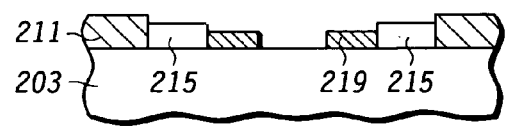
Figure 25:
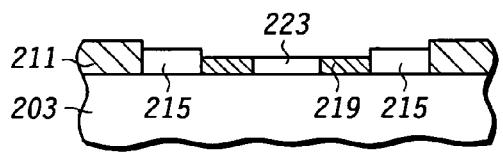
Figure 26:
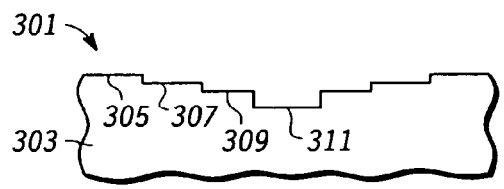
FIGS. 26–31 are illustrations of a multiple gate oxide fabrication process in accordance with the teachings herein.

Once again, a layer of photoresist 221 is deposited over the structure and is patterned through suitable photolithography techniques, thus yielding the structure depicted in FIG. 23 in which a portion of the sacrificial oxide layer 207 is exposed. As shown in FIG. 24, the exposed portion of the sacrificial oxide layer 207 is then etched down to the silicon substrate 203, and the layer of photoresist is stripped. A fourth gate oxide layer 223 is then grown on the exposed portion of the silicon substrate 203 as depicted in FIG. 25. If desired, the exposed portion of the silicon substrate 203 may be subjected to a pre-cleaning process prior to the growth of the fourth gate oxide layer 223.

As previously noted, the process depicted in FIGS. 13–25, and in particular the masking technique depicted therein, is advantageous in that it selectively exposes one region of the substrate at a time for the formation of a gate oxide layer having the particular thickness required for that region, with the result that each region of the substrate upon which semiconductor devices are to be grown is exposed only once to the wet chemicals used for oxide etching, photoresist stripping and pre-cleaning. Hence, as compared to conventional multi gate oxide processes, this process minimizes roughening of the substrate surface and maximizes the performance of the semiconductor devices grown thereon. Moreover, as a result of this approach, the core area of the integrated circuit is subjected to the same number of wet etch, photoresist strip, and pre-clean processes as the remaining portion of the structure upon which semiconductor devices are grown. Consequently, in integrated circuits made in accordance with this approach, the performance characteristics of the core devices will be on par with the characteristics of devices disposed in other regions of the substrate.

Various modifications are possible with respect to the methodologies disclosed herein, including the particular embodiment depicted in FIGS. 13–25. For example, in the methodologies disclosed herein, it is preferred that each region of the substrate upon which semiconductor devices are to be grown is exposed only once to the wet chemicals used for oxide etching, photoresist stripping and pre-cleaning. Hence, it is preferred that these regions are mutually exclusive. However, it will be appreciated that the methodologies disclosed herein offer significant advantages over conventional processes, even if there is some overlap between these regions.

Moreover, while the embodiment depicted in FIGS. 13–25 is shown beginning with a substrate 203 having a sacrificial oxide layer 207 disposed thereon, one skilled in the art will appreciate that the process may begin with a substrate having any other suitable oxide layer thereon. Such other suitable oxide layer may be, for example, any of the first, second, third or fourth gate oxide layers disclosed herein. Also, while the method depicted in FIGS. 13–25 is illustrated with respect to the formation of a QGO, it will be appreciated that the principles disclosed herein are applicable to DGO, TGO, or any multiple gate oxide integration.

Furthermore, as previously noted, for clarity of illustration, the features of the structures in each step of the non-limiting embodiment depicted in FIGS. 13–25 have been greatly simplified. Hence, one skilled in the art will appreciate that actual devices and methodologies made in accordance with the teachings herein will typically have other elements and features beyond those specifically depicted, and that these elements and features may take other forms. Thus, for example, while not explicitly shown, isolation structures would typically be disposed between gate oxide layers 211, 215, 219 and 223 (see, e.g., FIG. 25) to provide physical and electrical isolation between adjacent transistors having different thicknesses. These isolation structures would typically be in the form of shallow trench isolation (STI) structures or LOCOS structures. The formation of such structures, though not described herein, is well known in the art.

It will also be appreciated that the general principle of exposing each region of the substrate only once to the wet chemicals used for oxide etching, photoresist stripping and pre-cleaning may be achieved in a variety of ways. For example, in one possible embodiment which is illustrated in FIGS. 26–31, a device 301 is provided comprising a substrate 303 which has regions 305, 307, 309 and 311 thereon that have varying depths with respect to the major surface of the substrate. In the particular embodiment illustrated, the substrate 303 may be, for example, a silicon wafer on which bulk micromachining or other suitable methods have been employed to create a series of concentric steps or trenches in the substrate.

Figure 27:
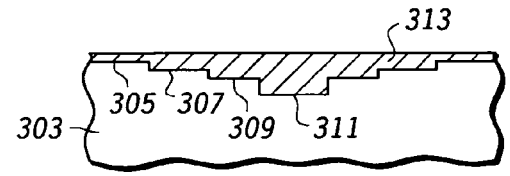

As shown in FIG. 27, a layer of sacrificial oxide 313 is grown over the substrate 303. The resulting structure is then subjected to chemical mechanical polishing or to other suitable techniques as are known to the art to planarize the surface of the sacrificial oxide layer, thus resulting in a structure which has a planar surface and a sacrificial oxide layer with different depths in each of the regions 305, 307, 309 and 311.

Figure 28:
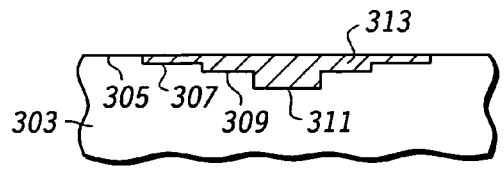
Figure 29:
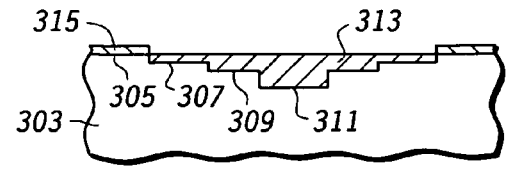
Figure 30:
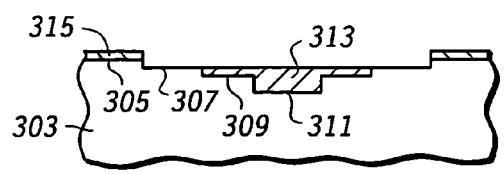
Figure 31:
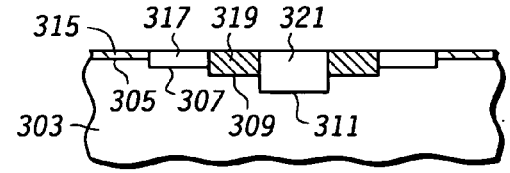

As shown in FIG. 28, a suitable etching technique may then be employed to etch the layer of sacrificial oxide 313 so as to selectively expose the region 305 of the substrate 303. This may be achieved, for example, through the use of an etch having an associated etch rate that does not significantly vary across the surface of the sacrificial oxide layer. Since the thickness of the sacrificial oxide layer 303 is less in the region 305 than it is in the remaining regions, the use of a mask here is optional. A first gate oxide 315 is then grown in the exposed region 305 as shown in FIG. 29.

Next, the gate oxide 315 is masked, and the remaining portion of the sacrificial oxide layer 313 is etched sufficiently such that the region 307 is now selectively exposed. The mask is then stripped, thus yielding the structure depicted in FIG. 30. This process is repeated as necessary to define the gate oxide layers 317, 319 and 321 shown in FIG. 31.

As with the previously described methods, this approach ensures that each region of the substrate is subjected to etching only once. It will be appreciated that, although this embodiment is illustrated with regions having increasing depth as one goes toward the center of the substrate, a similar result could be achieved with other dispositions of these regions. It will also be appreciated that this methodology may be utilized in conjunction with a substrate having any desired number of regions of different depths, and that each of these regions may be provided with a gate oxide layer having a thickness selected to accommodate devices operating at a particular voltage.

Figure 32:
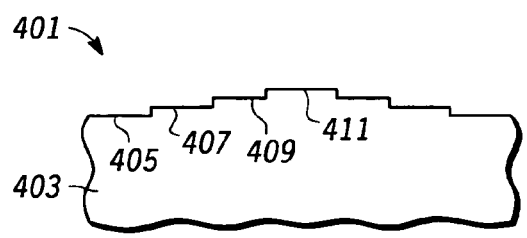
FIGS. 32–34 are illustrations of a multiple gate oxide fabrication process in accordance with the teachings herein.
Figure 33:
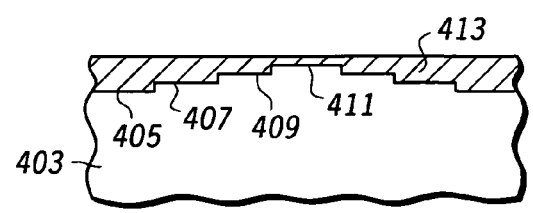
Figure 34:
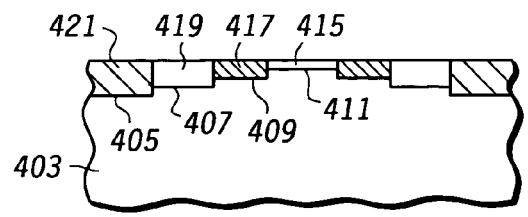

In a further variation of the aforementioned process which is illustrated in FIGS. 32–33, a device 401 is provided with a substrate 403 equipped with regions 405, 407, 409 and 411 that have varying heights above the major surface of the substrate 403. Such a substrate may be created, for example, through the use of suitable masking techniques used in combination with epitaxial growth. A layer of sacrificial oxide 413 is then grown on the substrate, and chemical mechanical polishing or other suitable techniques are used to create a structure having a planar surface and having a layer of sacrificial oxide with a varying depth. As with the embodiment illustrated in FIGS. 26–31, suitable masking, etching and growth processes may be used to selectively create gate oxide layers 415, 417, 419 and 421 in the different regions 405, 407, 409 and 411 (see FIG. 34), while exposing a given region of the substrate to wet etch, photoresist strip and pre-clean processes only once.

A number of variations are possible with respect to the methods depicted in FIGS. 26–33. For example, while these methods are illustrated with the formation or growth of the various gate oxide layers occurring in a stepwise fashion, it will be appreciated that formation or growth of the gate oxide layers in two or more regions could occur simultaneously. Suitable masking and etching techniques could then be used to reduce the gate oxide layer in a particular region to a desired thickness. Likewise, suitable masking and growth techniques could be used to increase the gate oxide layer in a particular region to a desired thickness. In some such embodiments, the gate oxide layers in the various regions may be formed on structures of the type illustrated in FIGS. 26 and 32, without the use of intervening sacrificial oxide layers.

The various methodologies and devices described herein have been specifically illustrated with reference to silicon substrates. However, it will be appreciated that these methodologies and devices may be used in conjunction with various other substrates, with suitable modifications as will be apparent to those skilled in the art. Such other substrates include, without limitation, silicon germanium, gallium arsenide, bulk substrates, silicon-on-insulator (SOI) substrates, and other semiconductor-on-insulator substrates.

Moreover, as previously noted, in the various methodologies described herein, one or more pre-cleaning steps may be utilized prior to the growth or formation of the gate oxide layers. Such pre-cleaning steps may include, but are not limited to, a sulfuric acid peroxide mixture (SPM) pre-clean, an ammonium peroxide mixture (APM) pre-clean, or a hydrochloric peroxide mixture (HPM) pre-clean. Various combinations and sub-combinations of the aforementioned pre-cleans may also be used. Thus, for example, in one particular, non-limiting embodiment, the pre-clean includes sequential treatment in the order SPM, APM and HPM, with each of the SPM, APM and HPM cleaning steps having a duration of about 10 minutes. The duration of the pre-clean and/or its component steps is preferably selected so as to minimize any surface roughening resulting from the pre-clean, and to maintain thickness of the gate oxide within a predetermined range.

The above description of the present invention is illustrative, and is not intended to be limiting. It will thus be appreciated that various additions, substitutions and modifications may be made to the above described embodiments without departing from the scope of the present invention. Accordingly, the scope of the present invention should be construed in reference to the appended claims.

What is claimed is:

1. A method for forming a multi gate oxide structure, comprising the steps of:
   providing a semiconductor substrate having an initial oxide layer thereon;
   depositing and patterning a first layer of photoresist on the initial oxide layer, thereby forming a first region in which the initial oxide layer is exposed;
   etching the initial oxide layer within the first region, thereby forming a first etched region;
   forming a first gate oxide layer within the first etched region;
   depositing and patterning a second layer of photoresist on the initial oxide layer and first oxide layer, thereby forming a second region in which the initial oxide layer is exposed;
   etching the exposed initial oxide layer within the second region, thereby forming a second etched region; and
   growing a second oxide layer within the second etched region;
wherein the first etched region is vertically disposed by a distance $d_1$ from a major surface of the substrate, wherein the second etched region is vertically disposed by a distance $d_2$ from the major surface, and wherein $d_2 > d_1$.

2. The method of claim 1, wherein the first and second gate oxide layers have first and second average thicknesses, respectively, and wherein the first average thickness is less than the second average thickness.

3. A multi gate oxide structure, comprising:
   a semiconductor substrate having first and second regions and having a first major surface, wherein said first region of the substrate is vertically disposed by a distance $d_1$ from said first major surface, and wherein said second region of the substrate is vertically disposed by a distance $d_2$ from said first major surface, wherein $d_2 > d_1$;
   a first gate oxide layer having a first average thickness disposed within said first region; and
   a second gate oxide layer having a second average thickness disposed within said second region.

4. The device of claim 3, wherein the first and second gate oxide layers have first and second average thicknesses, respectively, and wherein the first average thickness is less than the second average thickness.

5. The device of claim 3, wherein said first region has a first depth $d_1$ and wherein said second region has a depth $d_2$, and wherein $d_2 > d_1$.

6. The device of claim 3, wherein said first region has a first height $d_1$ and wherein said second region has a height $d_2$, and wherein $d_2 > d_1$.

7. The device of claim 3, wherein said first region has a first height $d_1$ and wherein said second region has a depth $d_2$.

8. A method for forming a semiconductor device, comprising:
providing a semiconductor substrate having a major surface, wherein said substrate contains a first region which is vertically disposed by a distance $d_1$ from the major surface, wherein said substrate contains a second region which is vertically disposed by a distance $d_2$ from the major surface, and wherein $d_2 > d_1$; and
forming a layer of gate oxide with the first and second regions.

9. The method of claim 8, wherein said first region extends above the major surface.

10. The method of claim 9, wherein said second region also extends above the major surface.

11. The method of claim 8, wherein said first region extends below the major surface.

12. The method of claim 11, wherein said second region also extends below the major surface.

13. The method of claim 8, wherein the step of forming a layer of gate oxide within the first and second regions includes the step of forming a single layer of oxide which extends across the first and second regions.

14. The method of claim 8, wherein the step of forming a layer of gate oxide within the first and second regions includes the steps of:
forming a first layer of gate oxide within the first region; and
forming a second layer of gate oxide within the second region.

15. The method of claim 8, wherein the step of forming a layer of gate oxide within the first and second regions includes the steps of:
selectively exposing a first region of the substrate;
forming a first gate oxide layer within the first region;
selectively exposing a second region of the substrate; and
forming a second gate oxide layer within the second region.

16. The method of claim 15, wherein the step of selectively exposing the first region of the substrate includes the steps of:
forming a first mask over the sacrificial oxide layer such that a first portion of the sacrificial oxide layer extending over the first region is exposed and a second portion of the sacrificial oxide layer extending over the second region is covered; and
etching the first portion of the sacrificial oxide layer.

17. The method of claim 16, wherein the step of selectively exposing the second region of the substrate includes the steps of:
forming a second mask over the sacrificial oxide layer such that a second portion of the sacrificial oxide layer extending over the second region is exposed and the first gate oxide layer is covered; and
etching the second portion of the sacrificial oxide layer.

18. The method of claim 15, wherein said substrate contains a third region which is vertically disposed by a distance $d_3$, from the major surface, wherein $d_3 > d_2 > d_1$, and further comprising the step of forming a layer of gate oxide within the first, second and third regions.

19. The method of claim 18, wherein the step of forming a layer of gate oxide within the third region includes the steps of:
selectively exposing the third region of the substrate; and
forming a third gate oxide layer within the third region.

20. The method of claim 8, further comprising the step of forming a single layer of sacrificial oxide which extends across the first and second regions.

21. The method of claim 20, further comprising the step of subjecting the sacrificial oxide to chemical mechanical polishing.

22. The device of claim 8, wherein the first and second gate oxide layers have first and second average thicknesses, respectively, and wherein the first average thickness is less than the second average thickness.

23. The device of claim 8, wherein said first region has a depth $d_1$, wherein said second region has a depth $d_2$.

24. The device of claim 8, wherein said first region has a height $d_1$ and wherein said second region has a height $d_2$.

25. The device of claim 8, wherein said first region has a height $d_1$ and wherein said second region has a depth $d_2$.

26. A method for forming a multi gate oxide structure, comprising:
providing a substrate having an initial oxide layer thereon, said substrate having a first major surface;
selectively exposing a first region of the substrate;
forming a first gate oxide layer within the first region;
selectively exposing a second region of the substrate; and
forming a second gate oxide layer within the second region;
wherein the first region of the substrate is vertically disposed by a distance $d_1$ from the first major surface, and wherein the second region of the substrate is vertically disposed by a distance $d_2$ from the first major surface.

* * * * *